(12) United States Patent
Takeya et al.

(10) Patent No.: US 9,978,727 B2
(45) Date of Patent: *May 22, 2018

(54) DISPLAY APPARATUS AND MANUFACTURING METHOD THEREOF

(71) Applicant: Seoul Semiconductor Co., Ltd., Ansan-si (KR)

(72) Inventors: Motonobu Takeya, Ansan-si (KR); Young Hyun Kim, Ansan-si (KR); Jong Ik Lee, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/442,907

(22) Filed: Feb. 27, 2017

(65) Prior Publication Data

US 2017/0250164 A1 Aug. 31, 2017

Related U.S. Application Data

(60) Provisional application No. 62/300,348, filed on Feb. 26, 2016.

(51) Int. Cl.
*H01L 25/075* (2006.01)
*H01L 27/12* (2006.01)
*H01L 33/50* (2010.01)

(52) U.S. Cl.
CPC ........ *H01L 25/0753* (2013.01); *H01L 27/124* (2013.01); *H01L 33/504* (2013.01); *H01L 2933/0041* (2013.01)

(58) Field of Classification Search
CPC . H01L 25/0753; H01L 27/124; H01L 33/504; H01L 2933/0041; H01L 51/0097; H01L 51/5253; H01L 2251/5338; H01L 27/3244; H01L 51/5246; H01L 27/3267; H01L 27/3262; H01L 27/3258

See application file for complete search history.

(56) References Cited

U.S. PATENT DOCUMENTS

| | | |
|---|---|---|
| 7,545,466 B2 | 6/2009 | Lee |
| 8,426,227 B1 | 4/2013 | Bibl et al. |
| 2017/0194304 A1* | 7/2017 | Takeya ................. H01L 25/167 |

FOREIGN PATENT DOCUMENTS

| | | |
|---|---|---|
| JP | 2015-500562 | 1/2015 |
| KR | 10-2006-0036131 | 4/2006 |
| KR | 10-2012-0075042 | 7/2012 |
| KR | 10-2013-0092896 | 8/2013 |
| KR | 10-2013-0137985 | 12/2013 |
| WO | 2015/193763 | 12/2015 |

* cited by examiner

*Primary Examiner* — Roy Potter
(74) *Attorney, Agent, or Firm* — H.C. Park & Associates, PLC (57) ABSTRACT

A display apparatus including a light emitting diode part including a plurality of regularly arranged light emitting diodes, and a thin-film transistor (TFT) panel part including a plurality of TFTs configured to drive the light emitting diodes disposed on the TFT panel part. The light emitting diode part further includes a transparent substrate disposed on the light emitting diodes, and a phosphor layer disposed on the transparent substrate and configured to emit at least one of blue light, green light, and red light by converting at least a portion of a wavelength of light emitted from the light emitting diodes, in which a thickness of the transparent substrate is less than a thickness of the phosphor layer.

14 Claims, 5 Drawing Sheets

DISPLAY APPARATUS AND MANUFACTURING METHOD THEREOF

CROSS-REFERENCE TO RELATED APPLICATION

This application claims priority from and the benefit of U.S. Provisional Patent Application No. 62/300,348, filed on Feb. 26, 2016, which is hereby incorporated by reference for all purposes as if fully set forth herein.

BACKGROUND

Field

Exemplary embodiments relate to a display apparatus and a method of manufacturing the same, and more particularly, to a display apparatus using micro-light emitting diodes and a method of manufacturing the same.

Discussion of the Background

A light emitting diode generally refers to an inorganic semiconductor device that emits light through recombination of electrons and holes. Light emitting diodes have been recently used in various fields including displays, automobile lamps, general lighting, and the like. A light emitting diode has various advantages, such as long lifespan, low power consumption, and rapid response. As such, a light emitting device using a light emitting diode is used as a light source in various fields.

Recently, smart TVs or monitors may realize colors using a thin-film transistor liquid crystal display (TFT LCD) panel and use light emitting diodes (LEDs) as a light source for a backlight unit to display a color. In addition, a display apparatus is often manufactured using organic light emitting diodes (OLEDs).

In a TFT-LCD, since one LED may be used as a light source for many pixels, a backlight light source must be kept in a turned-on state. As a result, the TFT-LCD may suffer from constant power consumption regardless of the brightness of a displayed screen. On the other hand, although power consumption of an OLED has been continuously reduced due to ongoing development of the technology, the OLED still has much higher power consumption than LEDs formed of inorganic semiconductors. Thus, OLEDs have a lower efficiency than LEDs.

Moreover, a passive matrix (PM) drive type OLED may suffer from deterioration in response speed from controlling pulse amplitude modulation (PAM) of the OLED having large capacitance, and may also suffer from deterioration in lifespan upon high current driving through pulse width modulation (PWM) for realizing a low duty ratio. Moreover, an active matrix (AM) driving type OLED may require connection of TFTs for each pixel, which may increase in manufacturing costs and cause non-uniform brightness according to the characteristics of the TFTs.

SUMMARY

Exemplary embodiments provide a display apparatus using micro-light emitting diodes having low power consumption that may be applicable to a wearable apparatus, a smartphone, or a TV, and a method of manufacturing the same.

According to an exemplary embodiment, a display apparatus includes a light emitting diode part including a plurality of regularly arranged light emitting diodes, and a thin-film transistor (TFT) panel part including a plurality of TFTs configured to drive the light emitting diodes disposed on the TFT panel part. The light emitting diode part further includes a transparent substrate disposed on the light emitting diodes, and a phosphor layer disposed on the transparent substrate and configured to emit at least one of blue light, green light, and red light by converting at least a portion of a wavelength of light emitted from the light emitting diodes, in which a thickness of the transparent substrate is less than a thickness of the phosphor layer.

The transparent substrate may have a thickness equal to or less than 10 μm.

The phosphor layer may include a green phosphor layer configured to emit green light by converting a wavelength of light emitted from the light emitting diodes, and a red phosphor layer configured to emit red light by converting a wavelength of light emitted from the light emitting diodes.

The light emitting diodes may include blue light emitting diodes configured to emit blue light, and the phosphor layer may further include a transparent layer transmitting light emitted from the light emitting diodes without a wavelength conversion.

Each of the light emitting diodes may include an n-type semiconductor layer, a p-type semiconductor layer, an active layer interposed between the n-type semiconductor layer and the p-type semiconductor layer, an n-type electrode coupled to the n-type semiconductor layer, and a p-type electrode coupled to the p-type semiconductor layer.

The display apparatus may further include an anisotropic conductive film electrically connecting the light emitting diode part to the TFT panel part.

According to an exemplary embodiment, a display apparatus includes a light emitting diode part including a plurality of regularly arranged light emitting diodes, and a thin-film transistor (TFT) panel part including a plurality of TFTs configured to drive the light emitting diodes disposed on the TFT panel part. The light emitting diode part further includes a transparent substrate disposed on the light emitting diodes, and a phosphor layer disposed on the transparent substrate and configured to emit at least one of blue light, green light, and red light by converting at least a portion of a wavelength of light emitted from the light emitting diodes. The transparent substrate includes a plurality of sections each disposed on an upper surface of the light emitting diodes, respectively, and a blocking portion formed between the sections of the transparent substrate and blocking light emitted from the light emitting diodes.

The blocking portion may include a metal.

According to an exemplary embodiment, a display apparatus includes a light emitting diode part including a plurality of regularly arranged light emitting diodes, and a thin-film transistor (TFT) panel part including a plurality of TFTs configured to drive the light emitting diodes disposed on the TFT panel part. The light emitting diode part further includes a substrate disposed on the light emitting diodes and including a white phosphor configured to emit white light by converting a wavelength of light emitted from the light emitting diodes, and a color filter including a blue light portion, a green light portion, and a red light portion, each portion being configured to transmit blue light, green light, and red light, respectively, therethrough among white light emitted from the substrate. The substrate includes a plurality of sections each disposed on an upper surface of each light emitting diode, and a blocking portion formed between the sections and blocking light emitted from the light emitting diodes.

The color filter may further include a transparent portion configured to transmit white light emitted from the substrate therethrough without a wavelength conversion.

According to an exemplary embodiment, a method of manufacturing a display apparatus includes forming a substrate including a plurality of regularly arranged light emitting diodes, coupling the substrate to a thin-film transistor (TFT) panel part including a plurality of TFTs configured to drive the light emitting diodes, reducing a thickness of the substrate by etching or grinding the substrate, and forming a phosphor layer on an upper surface of the substrate, the phosphor layer being configured to emit at least one of blue light, green light, and red light by converting at least a portion of a wavelength of light emitted from the light emitting diodes, in which a thickness of the substrate is reduced to be less than a thickness of the phosphor layer.

The method may further include coupling the substrate to the TFT panel part by an anisotropic conductive film.

According to an exemplary embodiment, a method of manufacturing a display apparatus includes forming a substrate including a plurality of regularly arranged light emitting diodes, coupling the substrate to a thin-film transistor (TFT) panel part including a plurality of TFTs configured to drive the light emitting diodes, etching a portion of the substrate, forming a blocking portion on the etched substrate, such that light emitted from each of the light emitting diodes is prevented from being mixed with light emitted from adjacent light emitting diodes, and forming a phosphor layer on the substrate, the phosphor layer being configured to emit at least one of blue light, green light, and red light by converting at least a portion of a wavelength of light emitted from the light emitting diodes.

BRIEF DESCRIPTION OF DRAWINGS

The accompanying drawings, which are included to provide a further understanding of the disclosed technology, and are incorporated in and constitute a part of this specification, illustrate exemplary embodiments of the disclosed technology, and together with the description serve to describe the principles of the disclosed technology.

DETAILED DESCRIPTION OF THE ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, exemplary embodiments of the present disclosure will be described in detail with reference to the accompanying drawings.

Figure 1:
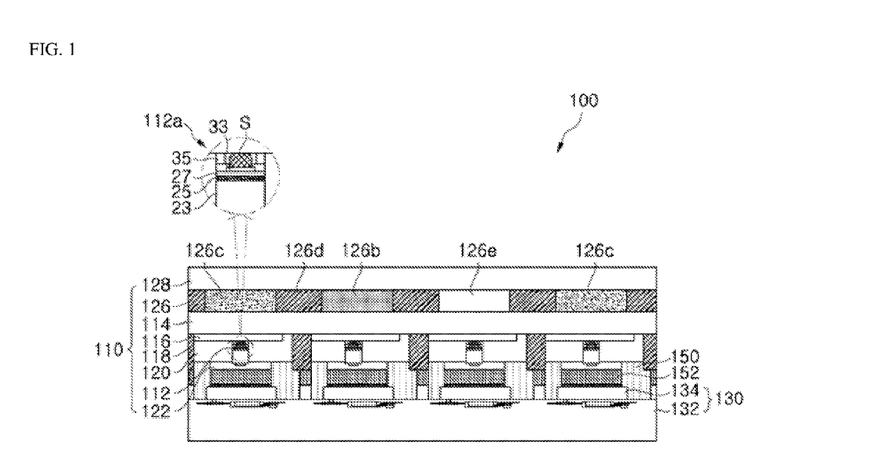
FIG. 1 is a cross-sectional view of a display apparatus according to an exemplary embodiment.

FIG. 1 is a cross-sectional view of a display apparatus according to an exemplary embodiment.

Referring to FIG. 1, the display apparatus 100 according to an exemplary embodiment includes a light emitting diode part 110, a TFT panel part 130, and an anisotropic conductive film 150.

The light emitting diode part 110 includes light emitting diodes 112, a support substrate 114, transparent electrodes 116, a first blocking portion 118, an insulation layer 120, first connection electrodes 122, a phosphor layer 126, and a protective substrate 128.

The light emitting diode part 110 includes a plurality of light emitting diodes 112, which are regularly arranged on the support substrate 114. For example, the plurality of light emitting diodes 112 may be arranged at constant intervals in a matrix form. The plurality of light emitting diodes 112 may include, for example, blue light emitting diodes emitting blue light, and may alternatively or additionally include UV light emitting diodes emitting UV light, as needed.

In the display apparatus 100, the light emitting diode part 110 may be driven by power applied from an exterior power source. More particularly, an image may be reproduced through on-off combination of the light emitting diodes 112 in the light emitting diode part 110, and red light, green light, and blue light may be emitted through the phosphor layer 126 without using a separate LCD. In FIG. 1, a region including a single light emitting diode 112 may be used as a subpixel in the display apparatus 100. In the light emitting diode part 110, one subpixel may have a larger size than the light emitting diode 112 disposed in the subpixel.

Each of the light emitting diodes 112 includes an n-type semiconductor layer 23, an active layer 25, a p-type semiconductor layer 27, an n-type electrode 31, a p-type electrode 33, and a wall 35.

The n-type semiconductor layer 23, the active layer 25, and the p-type semiconductor layer 27 may include Group III-V based compound semiconductors. For example, the n-type semiconductor layer 23, the active layer 25, and the p-type semiconductor layer 27 may include nitride semiconductors such as (Al, Ga, In)N. According to an exemplary embodiment, however, locations of the n-type semiconductor layer 23 and the p-type semiconductor layer 27 may be interchanged.

The n-type semiconductor layer 23 may include an n-type dopant (for example, Si) and the p-type semiconductor layer 27 may include a p-type dopant (for example, Mg). The active layer 25 is interposed between the n-type semiconductor layer 23 and the p-type semiconductor layer 27. The active layer 25 may have a multi-quantum well (MQW) structure, and the composition of the active layer 25 may be varied to emit light having a desired peak wavelength.

The light emitting structure including the n-type semiconductor layer 23, the active layer 25, and the p-type semiconductor layer 27 may have a structure that is similar to a vertical-type light emitting diode 112. In this case, the n-type electrode 31 may be formed on an outer surface of the n-type semiconductor layer 23, and the p-type electrode 33 may be formed on an outer surface of the p-type semiconductor layer 27.

As shown in FIG. 1, referring to an enlarged portion of a light emitting diode 112a, a bonding portion S may be formed between the p-type electrode 33 and the transparent electrode 116 to couple the light emitting diode 112, which has a structure similar to that of the vertical-type light emitting diode, to the transparent electrode 116 formed on the support substrate 114. Here, the wall 35 may be formed on the light emitting diode 112 to prevent the bonding portion S from escaping from a space between the p-type electrode 33 and the transparent electrode 116.

The wall 35 may be formed to cover a portion of the p-type electrode 33, such that the p-type electrode 33 may be exposed on the p-type semiconductor layer 27. The wall 35 may include a plurality of layers. For example, the wall 35 may include a first layer and a second layer, and may be formed by forming the first layer including SiN on the p-type semiconductor layer 27 to cover a portion of the p-type electrode 33, and then forming the second layer including $SiO_2$ on the first layer. The second layer may have a greater thickness and a smaller width than those of the first layer.

The support substrate 114 is a substrate on which the plurality of light emitting diodes 112 may be mounted, and may be an insulation substrate, a conductive substrate, or a printed circuit board. For example, the support substrate 114 may be at least one of a sapphire substrate, a gallium nitride substrate, a glass substrate, a silicon carbide substrate, a silicon substrate, a metal substrate, and a ceramic substrate. According to an exemplary embodiment, the support substrate 114 may be a transparent substrate that may transmit light emitted from the light emitting diodes 112. For example, the support substrate 114 may be a flexible glass substrate having a thickness of, for example, 30 μm to 100 μm.

The transparent electrode 116 may be formed on the support substrate 114, and may be electrically connected to the p-type electrode 33 of the light emitting diode 112. In FIG. 1, a plurality of transparent electrodes 116 may be formed on the support substrate 114, and may be coupled to the plurality of light emitting diodes 112, respectively. Alternatively, the plurality of light emitting diodes 112 may be coupled to one transparent electrode 116, as needed. In addition, the transparent electrodes 116 may be separated from each other on the support substrate 114. For example, the transparent electrodes 116 may include indium tin oxide (ITO) and the like.

The first blocking portion 118 is formed on the support substrate 114 and may be provided in plural. The first blocking portion 118 prevents light emitted from a certain light emitting diode 112 from being directed towards other light emitting diodes 112 adjacent thereto, when light emitted from the light emitting diodes 112 is emitted to the outside through the transparent electrodes 116. Accordingly, each of the first blocking portions 118 may be formed between the transparent electrodes 116 separated from each other, and may be formed to cover a portion of each of the transparent electrodes 116, as needed. The first blocking portion 118 may include, for example, aluminum (Al) or chromium (Cr).

The insulation layer 120 may surround the light emitting diode 112. The insulation layer 120 may cover an exposed surface of a connecting plane between the light emitting diode 112 and the transparent electrode 116, while covering the transparent electrode 116. When the insulation layer 120 surrounds the light emitting diode 112, the n-type semiconductor layer 23 and the n-type electrode 31 of the light emitting diode 112 may be exposed through the insulation layer 120.

The first connection electrode 122 covers the insulation layer 120, and may also cover the n-type semiconductor layer 23 and the n-type electrode 31 not covered by the insulation layer 120. Accordingly, the first connection electrode 122 may be electrically connected to the n-type semiconductor layer 23.

The phosphor layer 126 may be formed on an upper surface of the support substrate 114, and may include a green phosphor layer 126b, a red phosphor layer 126c and, a transparent layer 126e. In addition, a blocking layer 126d may be formed between the green phosphor layer 126b, the red phosphor layer 126c, and the transparent layer 126e. The green phosphor layer 126b, the red phosphor layer 126c, and the transparent layer 126e may be alternately arranged to be adjacent to one another or may be separated from one another by a predetermined distance.

The green phosphor layer 126b converts the wavelength of blue light emitted from the light emitting diodes 112 to emit green light, and the red phosphor layer 126c converts the wavelength of blue light emitted from the light emitting diode 112 to emit red light. In addition, the transparent layer 126e is disposed near the green phosphor layer 126b and the red phosphor layer 126c to transmit blue light emitted from the light emitting diodes 112a therethrough. Accordingly, red light, green light, and blue light may be emitted through the phosphor layer 126.

The protective substrate 128 may be formed on an upper surface of the phosphor layer 126. The protective substrate 128 may protect the phosphor layer 126 from an external environment by preventing the phosphor layer 126 from being directly exposed to the outside. The protective substrate 128 may include a transparent material, similarly to the support substrate 114. For example, the protective substrate 128 may be a glass substrate having a thickness of 30 μm to 100 μm.

The TFT panel part 130 includes a panel substrate 132 and second connection electrodes 134, and is coupled to the light emitting diode part 110 to supply power to the light emitting diode part 110. The TFT panel part 130 may control power supply to the light emitting diode part 110 such that only a portion the light emitting diodes 112 in the light emitting diode part 110 may emit light.

The panel substrate 132 may include a TFT drive circuit therein. The TFT drive circuit may be a circuit for driving an active matrix (AM) or a passive matrix (PM).

The second connection electrodes 134 may be electrically connected to the TFT drive circuit of the panel substrate 132 and to the first connection electrodes 122 of the light emitting diode part 110. In this manner, power supplied through the TFT drive circuit may be supplied to each of the light emitting diodes 112 through the first and second connection electrodes 122, 134. Although now shown, the second connection electrodes 134 may be covered by a separate protective layer, which may include, for example, $SiN_x$.

The anisotropic conductive film 150 may electrically connect the light emitting diode part 110 to the TFT panel part 130. The anisotropic conductive film 150 may include an adhesive organic insulation material and conductive particles uniformly dispersed therein for electrical connection. The anisotropic conductive film 150 may be conductive in the thickness direction thereof, and has insulating properties in the plane direction thereof. In addition, the anisotropic conductive film 150 may have adhesive properties. Thus, the anisotropic conductive film 150 may bond the light emitting diode part 110 to the TFT panel part 130, such that the light emitting diode part 110 may be electrically connected to the TFT panel part 130 therethrough. Particularly, the anisotropic conductive film 150 may connect ITO electrodes, which are known to be difficult to solder at high temperatures.

As such, when the light emitting diode part 110 is coupled to the TFT panel part 130 via the anisotropic conductive film 150, the first connection electrodes 122 of the light emitting diode part 110 may be electrically connected to the second connection electrodes 134 of the TFT panel part 130 via an electrode connection portion 152.

Figure 2:
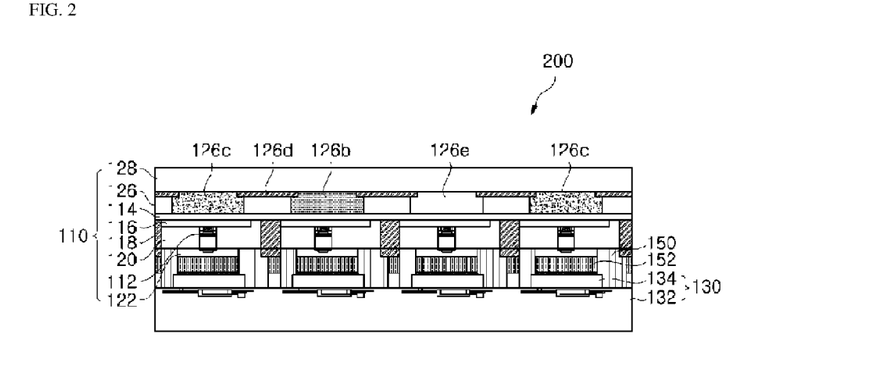
FIG. 2 is a cross-sectional view of a display apparatus according to an exemplary embodiment.

FIG. 2 is a cross-sectional view of a display apparatus according to an exemplary embodiment, and FIGS. 3A to 3D are cross-sectional views illustrating a method of manufacturing the display apparatus of FIG. 2 according to an exemplary embodiment.

Referring to FIG. 2, the display apparatus 200 according to an exemplary embodiment includes a light emitting diode part 110, a TFT panel part 130, and an anisotropic conductive film 150. The light emitting diode part 110 includes light emitting diodes 112, a support substrate 114, transparent electrodes 116, a first blocking portion 118, an insulation layer 120, first connection electrodes 122, a phosphor layer 126, and a protective substrate 128. The TFT panel part 130 includes a panel substrate 132 and second connection electrodes 134. The display apparatus 200 of FIG. 2 may include substantially the same components as those of the display apparatus 100 illustrated in FIG. 1. As such, repeated descriptions of substantially the same components will be omitted.

In FIG. 2, the support substrate 114 may include a transparent material such that light emitted from the plurality of light emitting diodes 112 is transmitted to the outside through the support substrate 114. The phosphor layer 126 may be formed on the upper surface of the support substrate 114. Here, light emitted from one of light emitting diodes 112 may need to be emitted to the outside only through the corresponding phosphor layer 126 disposed thereon after passing through the support substrate 114. More particularly, when light emitted from one light emitting diode 112 is emitted through another phosphor layer, instead of the corresponding phosphor layer 126 disposed thereon, the display apparatus 200 may not realize a desired color.

That is, one light emitting diode 112 may function as one subpixel, which realizes one color among blue light, green light, and red light. When light emitted from one light emitting diode 112 is emitted through the green phosphor layer 126b or the transparent layer 126e, instead of the corresponding red phosphor layer 126c disposed on the light emitting diode 112, green light and/or blue light may be emitted together with red light.

Accordingly, the support substrate 114 according to an exemplary embodiment may have a thickness less than a thickness of the support substrate 114 of the display apparatus 100 illustrated in FIG. 1. In the display apparatus 100 illustrated in FIG. 1, the support substrate 114 may have a thickness of 30 μm to 100 μm, whereas the support substrate 114 according to an exemplary embodiment illustrated with reference to FIG. 2 may have a thickness of 10 μm or less. In this manner, the display apparatus 200 according to an exemplary embodiment may allow light emitted from each of the light emitting diodes 112 to travel only towards one of the red phosphor layer 126c, the green phosphor layer 126b, and the transparent layer 126e disposed on the corresponding light emitting diodes 112. In addition, a thickness of the support substrate 114 may be less than a thickness of the phosphor layer 126.

Hereinafter, a method of manufacturing the display apparatus 200 including the support substrate 114 having a small thickness will be described with reference to FIGS. 3A to 3D, on which light emitting diode part 110 is formed.

Figure 3A:
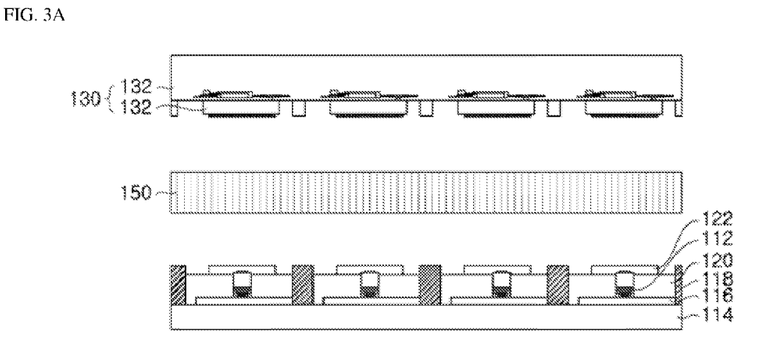
FIG. 3A, FIG. 3B, FIG. 3C, and FIG. 3D are cross-sectional views illustrating a method of manufacturing the display apparatus of FIG. 2 according to an exemplary embodiment.

Referring to FIG. 3A, a plurality of transparent electrodes 116, a plurality of light emitting diodes 112, a first blocking portion 118, an insulation layer 120, and first connection electrodes 122 are formed on the support substrate 114. A TFT panel part 130 is coupled to the light emitting diode part via an anisotropic conductive film 150.

Figure 3B:
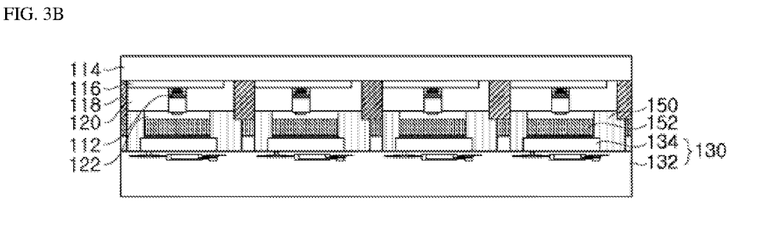
Figure 3C:
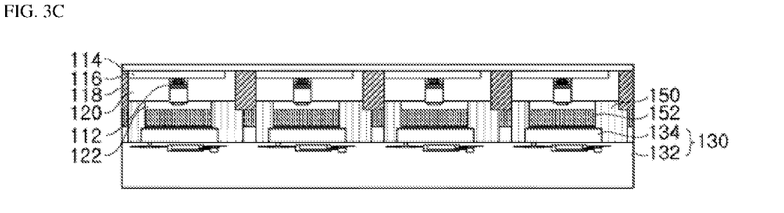

Referring to FIG. 3B, the display apparatus 200 including the TFT panel part 130 is rotated such that the support substrate 114 faces upward direction. Then, the upper surface of the support substrate 114 is subjected to etching or grinding to reduce the thickness of the support substrate 114. For example, the support substrate 114 having a thickness of about 30 μm to 100 μm may be etched or grinded to a small thickness of 10 μm or less. FIG. 3C shows the support substrate 114 after etching or grinding the support substrate 114 to reduce the thickness thereof.

Figure 3D:
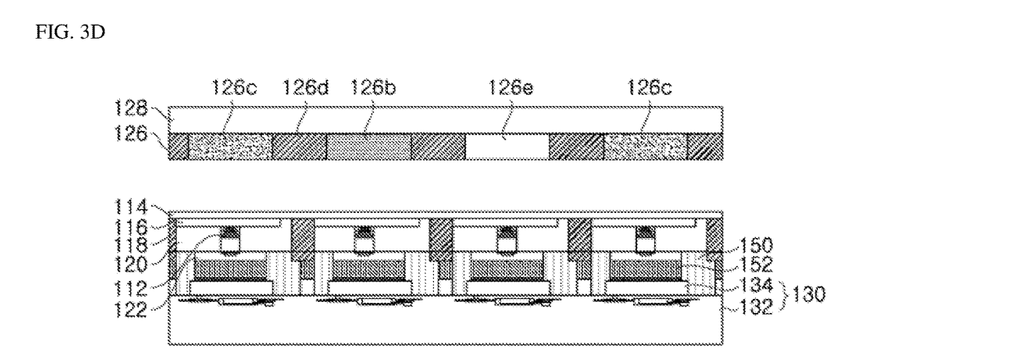

Referring to FIG. 3D, a phosphor layer 126 and a protective substrate 128 are bonded to an upper surface of the support substrate 114, thereby providing a display apparatus 200, as shown in FIG. 2.

Figure 4:
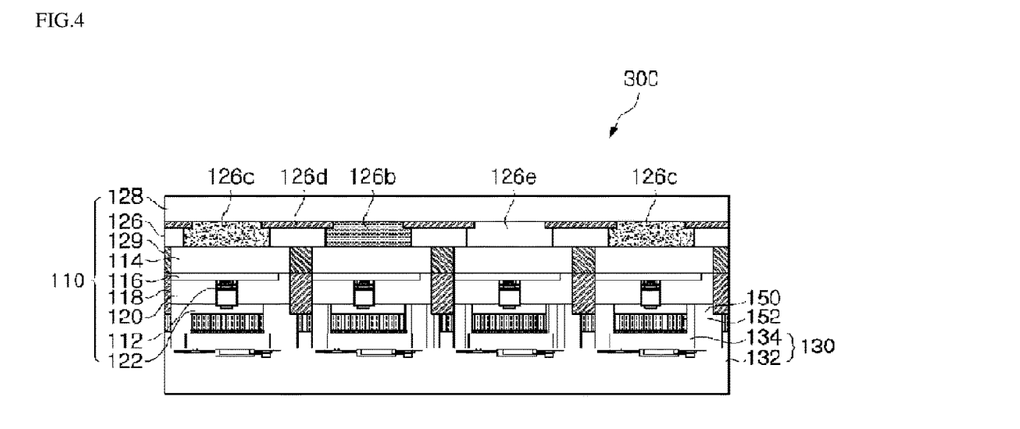
FIG. 4 is a cross-sectional view of a display apparatus according to an exemplary embodiment.

FIG. 4 is a cross-sectional view of a display apparatus according to an exemplary embodiment. FIGS. 5A to 5E are cross-sectional views illustrating a method of manufacturing the display apparatus of FIG. 4 according to an exemplary embodiment.

Referring to FIG. 4, the display apparatus 300 according an exemplary embodiment includes a light emitting diode part 110, a TFT panel part 130, and an anisotropic conductive film 150, a support substrate 114, transparent electrodes 116, a first blocking portion 118, an insulation layer 120, first connection electrodes 122, a phosphor layer 126, a protective substrate 128, and a second blocking portion 129. The light emitting diode part 110 includes light emitting diodes 112. The TFT panel part 130 includes a panel substrate 132 and second connection electrodes 134. The display apparatus 300 of FIG. 4 may include substantially the same components as those of the display apparatus 100 illustrated in FIG. 1. As such, repeated descriptions of substantially the same components will be omitted.

Referring to FIG. 4, the support substrate 114 according to an exemplary embodiment may include a transparent material, such that light emitted from the plurality of light emitting diodes 112 may be emitted to the outside through the support substrate 114 and the phosphor layer 126 formed on the upper surface of the support substrate 114. The support substrate 114 is divided into a plurality of support substrates (or sections) separated from each other, of which are disposed only on the corresponding light emitting diodes 112, respectively. In particular, the second blocking portion 129 may be formed between the support substrates 114.

The second blocking portion 129 may be provided in plural such that each of the second blocking portions 129 is disposed between adjacent support substrates 114. In this manner, the second blocking portion 129 may prevent light emitted from one light emitting diode from traveling towards another light emitting diode 112 adjacent thereto, when light emitted from the light emitting diodes travels towards the phosphor layer 126 through the support substrates 114.

More particularly, when the second blocking portion 129 is formed between the support substrates 114, light emitted from one light emitting diode 112 may be discharged to the outside through the support substrate 114 and the phosphor layer 126 disposed on the light emitting diode 112.

Hereinafter, a method of manufacturing the display apparatus 300 including the support substrate 114 and the second blocking portion 129 will be described with reference to FIGS. 5A to 5E, on which the light emitting diode part 110 is formed.

Figure 5A:
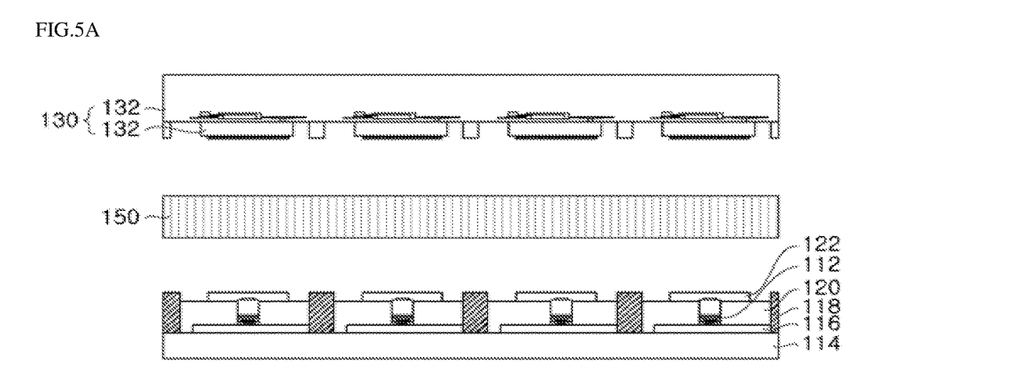
FIG. 5A, FIG. 5B, FIG. 5C, FIG. 5D, and FIG. 5E are cross-sectional views illustrating a method of manufacturing the display apparatus of FIG. 4 according to an exemplary embodiment.

Referring to FIG. 5A, a plurality of transparent electrodes 116, a plurality of light emitting diodes 112, first blocking portions 118, an insulation layer 120, and first connection electrodes 122 are formed on the support substrate 114. A TFT panel part 130 is coupled to the light emitting diode part via an anisotropic conductive film 150.

Figure 5B:
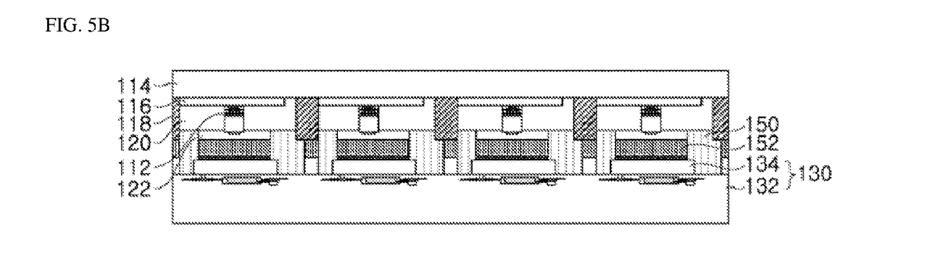
Figure 5C:
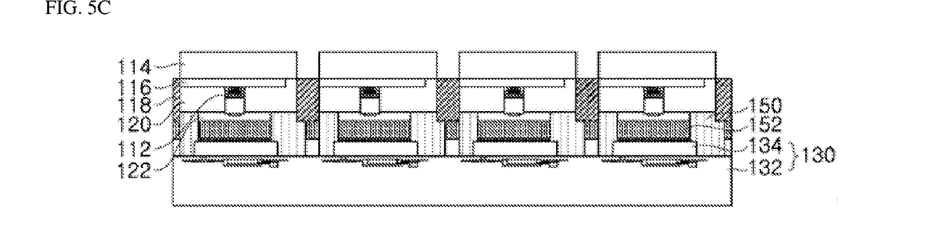

Referring to FIG. 5B, the display apparatus 300 including the TFT panel part 130 is rotated such that the support substrate 114 faces upward direction. Then, a portion of the support substrate 114 may be subjected to wet etching. The etching may be performed on a portion of the support substrate 114 overlapping the first blocking portion 118. As such, the support substrate 114 may be divided into a plurality of support substrates, and each of the first blocking portions 118 may be exposed through a space between the support substrates 114, as shown in FIG. 5C.

Although not shown in the drawings, the transparent electrodes 116 may be formed on the first blocking portion 118, which may also be etched together with the support substrate 114 during etching the support substrate 114. In this manner, a portion of the support substrate 114 disposed on the first blocking portion 118 may be removed by etching, such that the support substrate 114 may be formed to overlap each of the light emitting diodes 112.

Figure 5D:
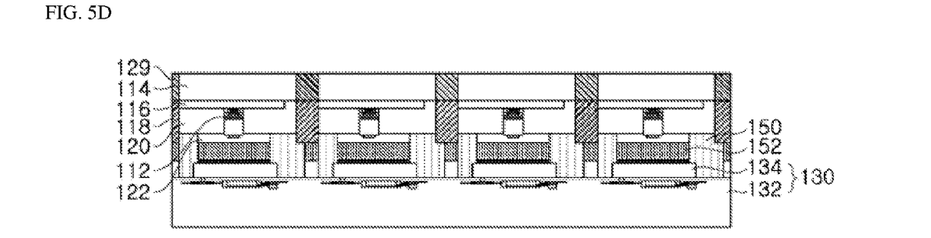

Then, as shown in FIG. 5D, the second blocking portion 129 may be formed on grooves, which are formed by partially etching the support substrate 114 described above. The second blocking portion 129 may include aluminum (Al) or chromium (Cr), similarly to the first blocking portion 118. In this manner, the second blocking portion 129 may be electrically connected to the first blocking portion 118, and the first and second blocking portions 118, 129 may function as common electrodes electrically connected to the transparent electrodes 116.

Figure 5E:
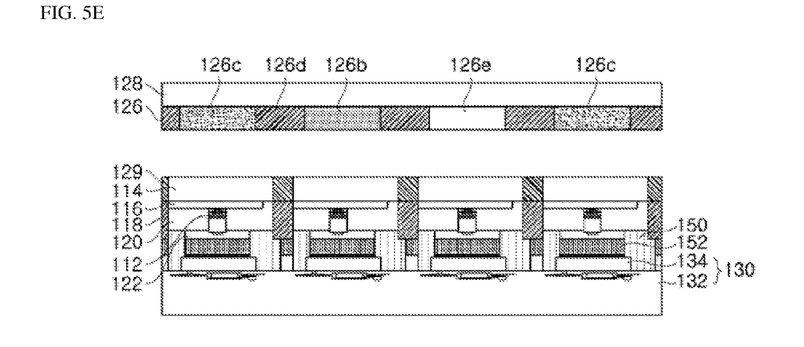

Then, as shown in FIG. 5E, after the support substrate 114 and the second blocking portion 129 are formed, a phosphor layer 126 and a protective substrate 128 may be attached to an upper surface of the support substrate 114, thereby fabricating the display apparatus 300 of FIG. 4.

Figure 6:
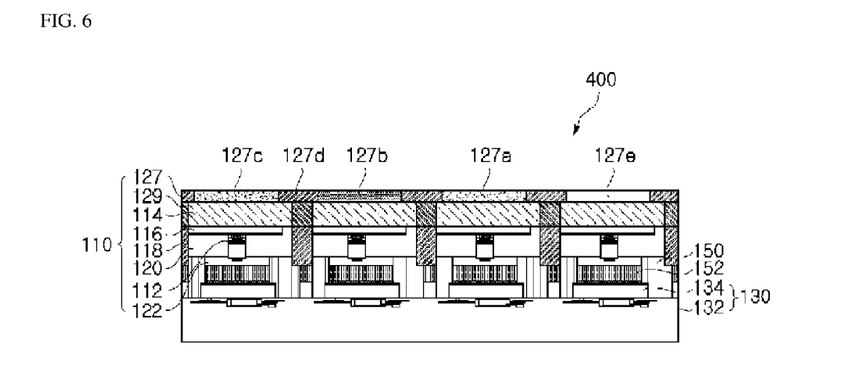
FIG. 6 is a cross-sectional view of a display apparatus according to an exemplary embodiment.

FIG. 6 is a cross-sectional view of a display apparatus according to an exemplary embodiment.

Referring to FIG. 6, the display apparatus 400 according to an exemplary embodiment includes a light emitting diode part 110, a TFT panel part 130, and an anisotropic conductive film 150. The light emitting diode part 110 includes light emitting diodes 112, a support substrate 114, transparent electrodes 116, a first blocking portion 118, an insulation layer 120, first connection electrodes 122, a second blocking portion 129, and a color filter 127. The display apparatus 400 of FIG. 6 may include substantially the same components as those of the display apparatus 100 illustrated in FIG. 1. As such, repeated descriptions of substantially the same components will be omitted.

The support substrate 114 according to an exemplary embodiment may include a transparent material and white phosphors therein. More particularly, the support substrate 114 may include a plurality of white phosphors and a receiving portion that receives the plurality of white phosphors therein. The receiving portion may be formed of a polymer resin, glass, or a ceramic material. Herein, the receiving portion will be described as being formed of a glass. That is, the support substrate 114 includes the plurality of phosphors dispersed in the receiving portion formed of a transparent glass.

The transparent electrodes 116, the plurality of light emitting diodes 112, the first blocking portion 118, the insulation layer 120, and the first connection electrodes 122 may be formed on the support substrate 114, as similar to the support substrate 114 of the display apparatus 100 of FIG. 1. In addition, the support substrate 114 including the white phosphors is divided into a plurality of support substrates 114 (or sections) by partially etching the support substrate 114. The second blocking portion 129 may be formed between the support substrates 114, as similar to the support substrate 114 of the display apparatus 200 of FIG. 4.

As a result, light emitted from the light emitting diodes 112 may be subjected to wavelength conversion into white light through the support substrates 114 formed on the light emitting diodes 112.

In addition, the color filter 127 may be formed on the upper surface of the support substrate 114. The color filter 127 may have a film shape, and filters white light emitted through the support substrate 114 including the white phosphors, such that one of blue light, green light, and red light may be emitted through the color filter 127. To this end, the color filter 127 includes a blue light portion 127a that filters white light to allow blue light to pass therethrough, a green light portion 127b that filters white light to allow green light to pass therethrough, and a red light portion 127c that filters white light to allow red light to pass therethrough. The color filter 127 may further include a transparent portion 127e that allows white light to pass therethrough, as needed.

The blue light portion 127a, the green light portion 127b, the red light portion 127c, and the transparent portion 127e may be disposed adjacent to one another, and a light blocking portion 127d may be further formed between the blue light portion 127a, the green light portion 127b, the red light portion 127c, and the transparent portion 127e.

Figure 7:
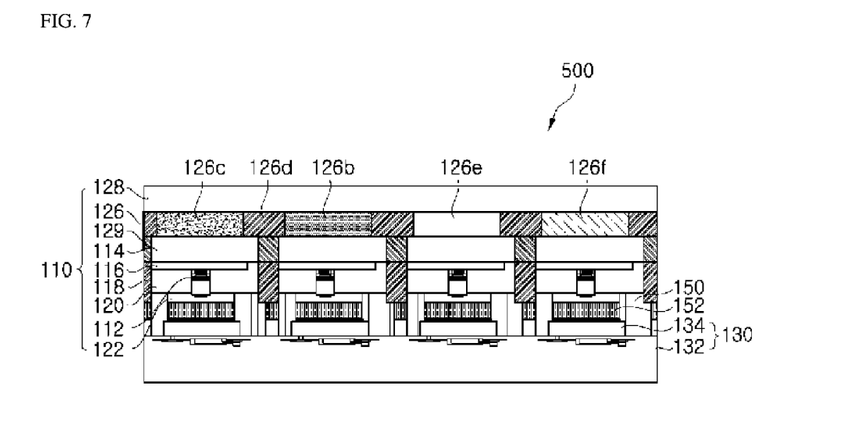
FIG. 7 is a cross-sectional view of a display apparatus according to an exemplary embodiment.

FIG. 7 is a cross-sectional view of a display apparatus according to an exemplary embodiment.

Referring to FIG. 7, the display apparatus 500 according to an exemplary embodiment includes a light emitting diode part 110, a TFT panel part 130, and an anisotropic conductive film 150. The light emitting diode part 110 includes light emitting diodes 112, a support substrate 114, transparent electrodes 116, a first blocking portion 118, an insulation layer 120, first connection electrodes 122, a phosphor layer 126, a protective substrate 128, and a second blocking portion 129. The TFT panel part 130 includes a panel substrate 132 and second connection electrodes 134. The display apparatus 500 of FIG. 7 may include substantially the same components as those of the display apparatus 100 and 300 illustrated in FIGS. 1 and 4. As such, repeated descriptions of substantially the same components will be omitted.

In FIG. 7, the light emitting diodes 112 may be blue light emitting diodes, and the phosphor layer 126 includes a green phosphor layer 126b, a red phosphor layer 126c, a blocking layer 126d, a transparent layer 126e, and a white phosphor layer 126f. Accordingly, the phosphor layer 126 may emit green light, red light, blue light, and white light through wavelength conversion of blue light emitted from the light emitting diodes 112.

In FIG. 7, yttrium aluminum garnet (YAG) phosphors may be used to convert the wavelength of the blue light emitted from the light emitting diodes 112 into white light, and the white phosphor layer 126f may be disposed adjacent to the green phosphor layer 126b, the red phosphor layer 126c, and the transparent layer 126e. In addition, the blocking layer 126d may be further disposed between the green phosphor layer 126b, the red phosphor layer 126c, the transparent layer 126e, and the white phosphor layer 126f.

According to exemplary embodiments, the display apparatus may include micro-light emitting diodes formed of nitride semiconductors, and thus, may have high efficiency and high resolution that may be applicable to a wearable apparatus, while reducing power consumption.

In addition, according to exemplary embodiments, the display apparatus may include a blocking portion that prevents light emitted from one light emitting diode and passed through a phosphor layer from being mixed with light emitted from other light emitting diodes on a transparent support substrate, so as to prevent light emitted from one light emitting diode from being transferred to other subpixels, thereby realizing a desired color.

Although certain exemplary embodiments have been described herein, it should be understood by those skilled in the art that these embodiments are given by way of illustration only, and that various modifications, variations, and alterations can be made without departing from the spirit and scope of the invention. Therefore, the scope of the invention should be limited only by the accompanying claims and equivalents thereof.

What is claimed is:
1. A display apparatus comprising:
 a light emitting diode part comprising a plurality of regularly arranged light emitting diodes; and
 a thin-film transistor (TFT) panel part comprising a plurality of TFTs configured to drive the light emitting diodes disposed on the TFT panel part,
 wherein the light emitting diode part further comprises:
  a transparent substrate disposed on the light emitting diodes; and
  a phosphor layer disposed on the transparent substrate and configured to emit at least one of blue light, green light, and red light by converting at least a portion of a wavelength of light emitted from the light emitting diodes, and
 wherein a thickness of the transparent substrate is less than a thickness of the phosphor layer.

2. The display apparatus of claim 1, wherein the transparent substrate has a thickness equal to or less than 10 μm.

3. The display apparatus of claim 1, wherein the phosphor layer comprises:
 a green phosphor layer configured to emit green light by converting a wavelength of light emitted from the light emitting diodes; and
 a red phosphor layer configured to emit red light by converting a wavelength of light emitted from the light emitting diodes.

4. The display apparatus of claim 3, wherein:
 the light emitting diodes comprises blue light emitting diodes configured to emit blue light; and the phosphor layer further comprises a transparent layer transmitting light emitted from the light emitting diodes without a wavelength conversion.

5. The display apparatus of claim 1, wherein each of the light emitting diodes comprises:
an n-type semiconductor layer;
a p-type semiconductor layer;
an active layer interposed between the n-type semiconductor layer and the p-type semiconductor layer;
an n-type electrode coupled to the n-type semiconductor layer; and
a p-type electrode coupled to the p-type semiconductor layer.

6. The display apparatus of claim 1, further comprising an anisotropic conductive film electrically connecting the light emitting diode part to the TFT panel part.

7. A display apparatus comprising:
a light emitting diode part comprising a plurality of regularly arranged light emitting diodes; and
a thin-film transistor (TFT) panel part comprising a plurality of TFTs configured to drive the light emitting diodes disposed on the TFT panel part,
wherein the light emitting diode part further comprises:
a transparent substrate disposed on the light emitting diodes; and
a phosphor layer disposed on the transparent substrate and configured to emit at least one of blue light, green light, and red light by converting at least a portion of a wavelength of light emitted from the light emitting diodes, and
wherein the transparent substrate comprises:
a plurality of sections each disposed on an upper surface of the light emitting diodes, respectively; and
a blocking portion formed between the sections of the transparent substrate and blocking light emitted from the light emitting diodes.

8. The display apparatus of claim 7, wherein the blocking portion comprises a metal.

9. A display apparatus comprising:
a light emitting diode part comprising a plurality of regularly arranged light emitting diodes; and
a thin-film transistor (TFT) panel part comprising a plurality of TFTs configured to drive the light emitting diodes disposed on the TFT panel part,
wherein the light emitting diode part further comprises:
a substrate disposed on the light emitting diodes and comprising a white phosphor configured to emit white light by converting a wavelength of light emitted from the light emitting diodes; and
a color filter comprising a blue light portion, a green light portion, and a red light portion, each portion being configured to transmit blue light, green light, and red light, respectively, therethrough among white light emitted from the substrate, and
wherein the substrate comprises:
a plurality of sections each disposed on an upper surface of each light emitting diode; and
a blocking portion formed between the sections and blocking light emitted from the light emitting diodes.

10. The display apparatus of claim 9, wherein the color filter further comprises a transparent portion configured to transmit white light emitted from the substrate therethrough without a wavelength conversion.

11. A method of manufacturing a display apparatus, the method comprising:
forming a substrate comprising a plurality of regularly arranged light emitting diodes;
coupling the substrate to a thin-film transistor (TFT) panel part comprising a plurality of TFTs configured to drive the light emitting diodes;
reducing a thickness of the substrate by etching or grinding the substrate; and
forming a phosphor layer on an upper surface of the substrate, the phosphor layer being configured to emit at least one of blue light, green light, and red light by converting at least a portion of a wavelength of light emitted from the light emitting diodes,
wherein a thickness of the substrate is reduced to be less than a thickness of the phosphor layer.

12. The method of claim 11, further comprising coupling the substrate to the TFT panel part by an anisotropic conductive film.

13. A method of manufacturing a display apparatus, the method comprising:
forming a substrate having a plurality of regularly arranged light emitting diodes;
coupling the substrate to a thin-film transistor (TFT) panel part comprising a plurality of TFTs configured to drive the light emitting diodes;
etching a portion of the substrate;
forming a blocking portion on the etched substrate, such that light emitted from each of the light emitting diodes is prevented from being mixed with light emitted from adjacent light emitting diodes; and
forming a phosphor layer on the substrate, the phosphor layer being configured to emit at least one of blue light, green light, and red light by converting at least a portion of a wavelength of light emitted from the light emitting diodes.

14. The method of claim 13, further comprising coupling the substrate to the TFT panel part by an anisotropic conductive film.

* * * * *